United States Patent [19]

Asano

[11] Patent Number: 5,592,001
[45] Date of Patent: Jan. 7, 1997

[54] NON-VOLATILE SEMICONDUCTOR MEMORY DEVICE

[75] Inventor: Masamichi Asano, Tokyo-To, Japan

[73] Assignee: Kabushiki Kaisha Toshiba, Kawasaki, Japan

[21] Appl. No.: 626,148

[22] Filed: Apr. 5, 1996

Related U.S. Application Data

[63] Continuation of Ser. No. 247,481, May 23, 1994, abandoned, which is a continuation of Ser. No. 718,407, Jun. 24, 1991, abandoned.

[30] Foreign Application Priority Data

Jun. 22, 1990 [JP] Japan ................................. 2-164678

[51] Int. Cl.$^6$ ............................................. H01L 29/788
[52] U.S. Cl. .......................... 257/316; 257/315; 257/321; 365/185.05; 365/185.26
[58] Field of Search ..................................... 257/321, 315, 257/316; 365/185.05, 185.26

[56] References Cited

U.S. PATENT DOCUMENTS

| | | | |
|---|---|---|---|
| 4,462,090 | 7/1984 | Iizuka | 257/316 |
| 4,807,188 | 2/1989 | Casagrande | 365/185 |
| 4,967,393 | 10/1990 | Yokoyama et al. | 365/185 |
| 5,034,798 | 7/1991 | Ohsima | 257/315 |

FOREIGN PATENT DOCUMENTS

| | | |
|---|---|---|
| 0282137 | 9/1988 | European Pat. Off. . |
| 0293339 | 11/1988 | European Pat. Off. . |
| 0354859 | 2/1990 | European Pat. Off. . |
| 1-196794 | 8/1989 | Japan ................................. 365/185 |

OTHER PUBLICATIONS

Cioaca et al., "A Million–cycle CMOS 256K EEPROM", Digest of Technical Papers, p. 78, 1987. IEEE Int. Sol. St. Cir. Conf.

Ali et al., "A 50–ns 256K CMOS Split–Gate EPROM", *IEEE Journal of Soid State Circuits*, vol. 23, No. 1, Feb. 1988, New York, pp. 79–85.

*Primary Examiner*—Jerome Jackson, Jr.
*Attorney, Agent, or Firm*—Foley & Lardner

[57] ABSTRACT

There is disclosed a non-volatile semiconductor memory device wherein a pair of memory cells constituting one bit data memory unit are connected to a data line in a manner that their drains are commonly connected. When compared to the case where drains of two memory cells are respectively connected to different data lines, the number of the connecting portions between drains and data lines is reduced and the area required for connection is lessened. Thus, a semiconductor memory device satisfactorily miniaturized from the viewpoint of practical use is provided. Further, since there is employed an arrangement such that the one bit data memory unit is comprised of two (a pair of) memory cells, the reliability can be improved. Individual select transistors may be arranged between the drain common junctions in the pair of memory cells, respectively, or a common select transistor may be arranged therebetween. In addition, the sources of the two memory cells may be respectively formed as individual sources.

6 Claims, 17 Drawing Sheets

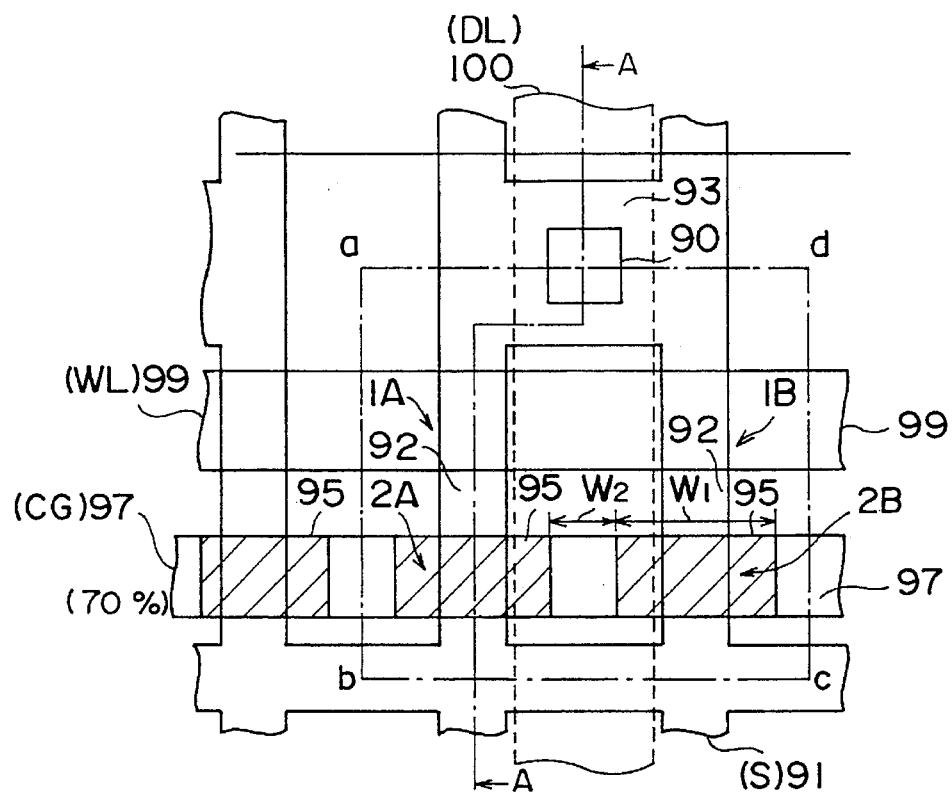
FIG. 8
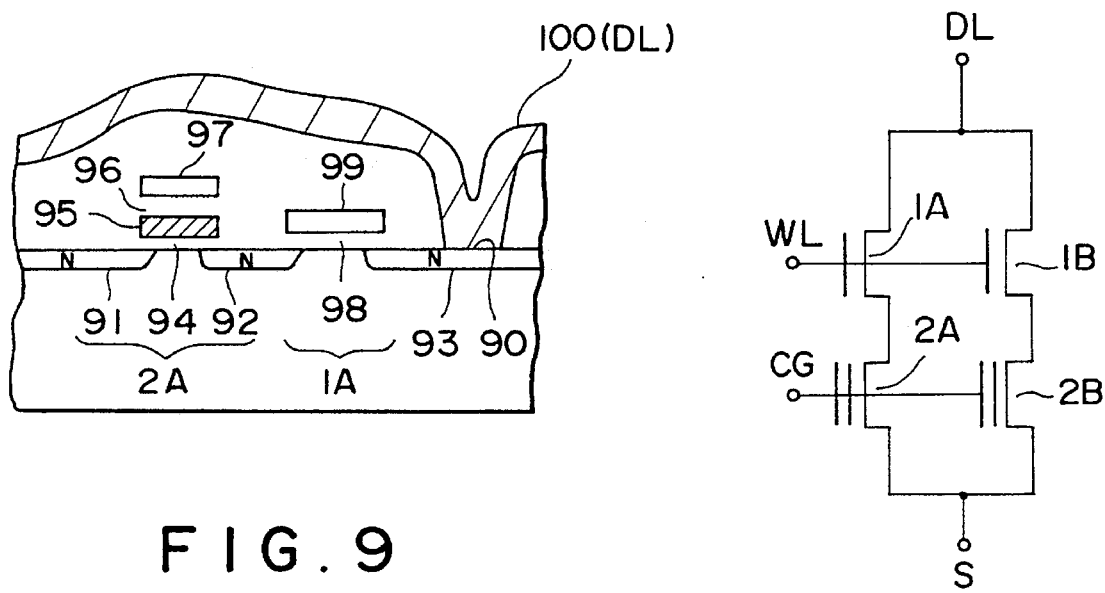
FIG. 9
FIG. 10

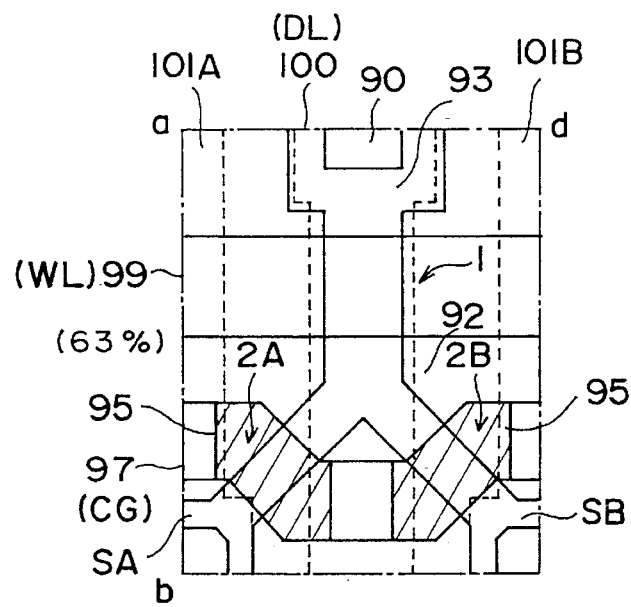
FIG. 17
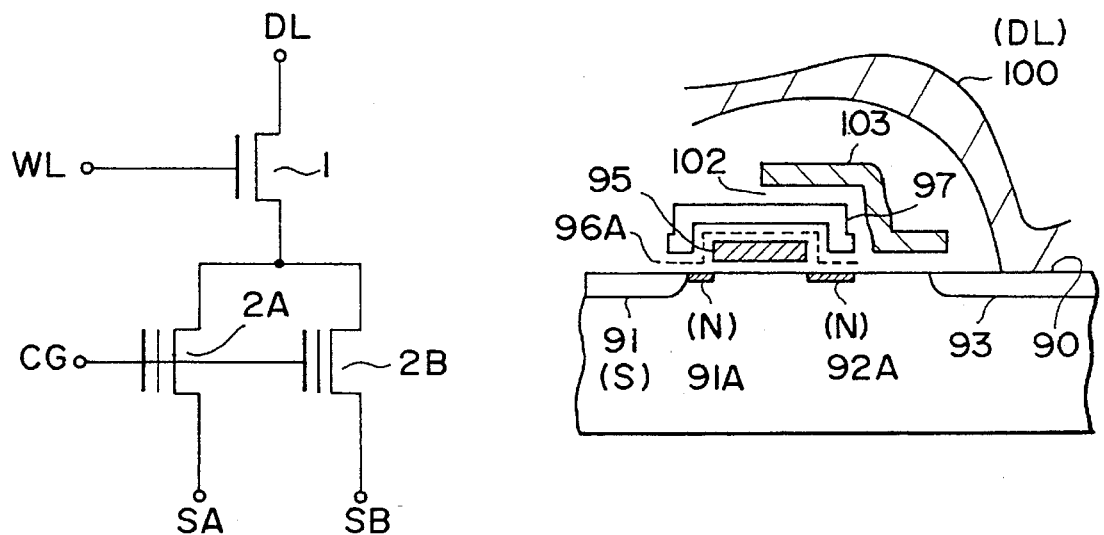
FIG. 18
FIG. 22

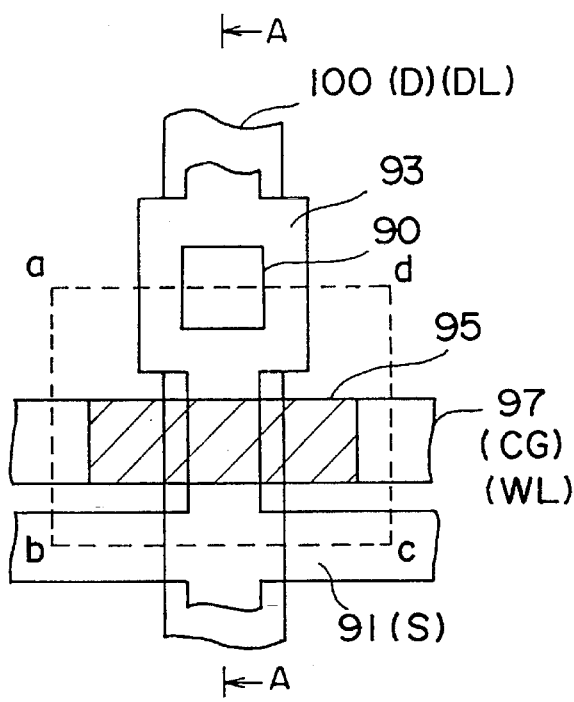
FIG. 23
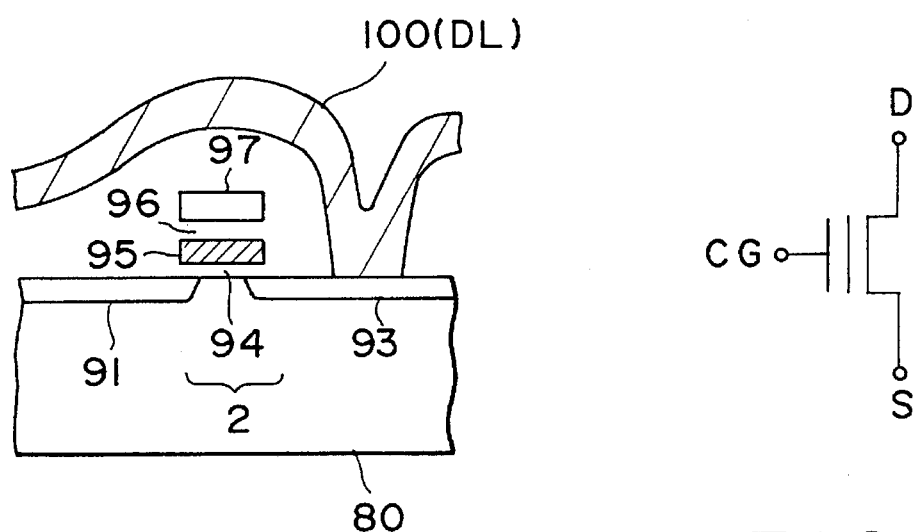
FIG. 24
FIG. 25

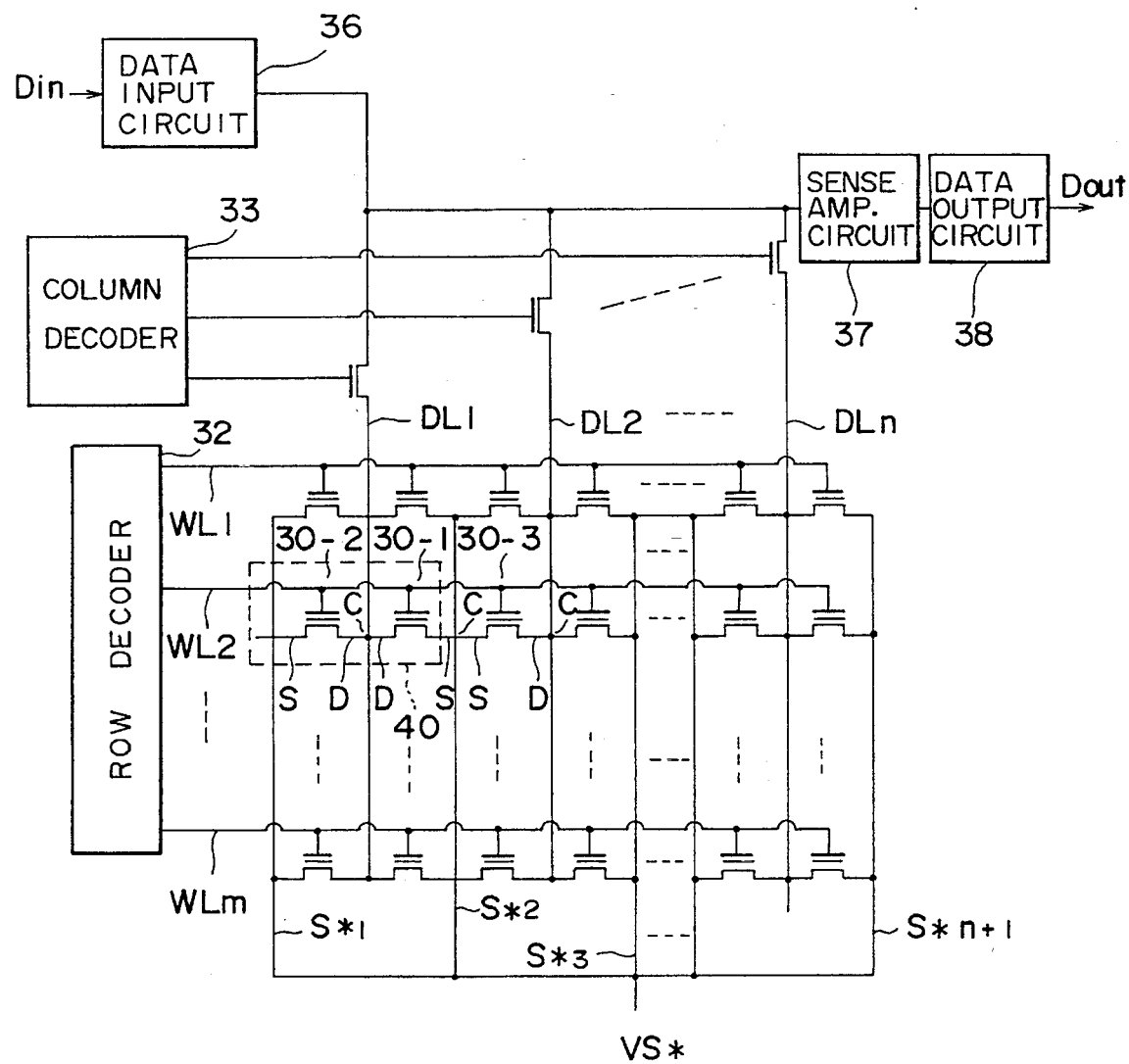
F I G. 29

SECTION A-A'

SECTION B-B'

NON-VOLATILE SEMICONDUCTOR MEMORY DEVICE

This application is a continuation of application Ser. No. 08/247,481, filed May 23, 1994, abandoned which is a continuation of Ser. No. 07/718,407 filed Jun. 24, 1991 abandoned.

BACKGROUND OF THE INVENTION

This invention relates to a non-volatile semiconductor memory device.

A ROM capable of electrically erasing the stored contents and rewriting them is known as an EEPROM (Electrically Erasable Programmable ROM). Unlike EPROMs of the ultraviolet light erasable type, such EEPROMs mounted on a board can erase data by an electric signal alone. For this reason, EEPROMs are frequently used for various controls or memory cards.

FIG. 1 is a cross sectional view showing the device structure of a typical memory cell in the EEPROM, and FIG. 2 is an equivalent circuit diagram thereof. In FIG. 1, for example, on a P-type substrate 80, N-type diffused regions 91, 92 and 93 are provided. Between the diffused regions 91 and 92 on the substrate 80, a floating gate electrode 95 formed of a polycrystalline silicon layer of the first layer is provided on an insulating oxide film 94. This floating gate electrode 95 overlaps with the N-type diffused region 92 through a thin film portion 94A of the insulating oxide film 94. On the floating gate electrode 95, a gate electrode 97 formed of a polycrystalline silicon layer of the second layer is provided on an insulating oxide film 96. Further, between the diffused regions 92 and 93 on the substrate 80, a gate electrode 99 formed of a polycrystalline silicon layer is provided on an insulating oxide film 98.

The memory cell of FIG. 1 includes two transistors 1 and 2. Namely, one is a transistor 2 having a floating gate (called floating gate transistor hereinafter) as a non-volatile memory element having the N-type diffused region 91 as the source, the N-type diffused region 92 as the drain, the floating gate electrode 95 as the floating gate, and the gate electrode 97 as the control gate. The other is a select transistor 1 of enhancement type having the N-type diffused region 92 as the source, the N-type diffused region 93 as the drain, and the gate electrode 99 as the gate. These transistors 1 and 2 are connected in series. As indicated by the equivalent circuit of FIG. 2, the drain and the gate of the transistor 1 are used as the data line DL and the word line WL, respectively. The floating gate and the control gate of the floating gate transistor 2 are used as the floating gate FG and the control gate CG, respectively, and the source of the floating gate transistor 2 is used as the source S. It is to be noted that the memory cell of FIG. 1 constitutes a one bit data memory unit (memory element) for storing data of one bit.

In the memory cell using a floating gate transistor as described above, as long as data erasing is not conducted, data once written is permanently held from an ideal point of view. However, in the case of an actual memory cell, after erasing or writing of data is carried out, charges in the floating gate are discharged with the lapse of time, and the stored data disappears. Particularly in the case of a cell where there is some defect in an insulating oxide film, etc., this charge dissipation occurs to a considerable degree. According to these circumstances, the memory cell becomes defective when used.

Generally, as a technique for evaluating the holding characteristic of stored data, there is known a method of placing the memory cell in a high temperature state to accelerate the rate of occurrence of such deterioration. This method is called a high temperature shelf test. FIG. 3 is a characteristic curve showing changes in the threshold voltage ($V_{th}$) of the floating gate transistor when the high temperature shelf test is conducted at 300° C. The threshold voltage in an initial state is about 1 volt as indicated by a broken line.

The case where electrons are discharged from the floating gate to store data of the "0" level will be first described. At this time, the threshold voltage of the floating gate transistor takes a substantially negative value, e.g., −5 volts. For this reason, a current flows even if the potential on the control gate is zero volts.

The case where electrons are injected into the floating gate to store data of "1" level will now be described. The threshold voltage of the floating gate transistor takes a substantially high value, e.g., +10 volts.

At the time of readout of data, the potential on the control gate is set to zero volts. The judgment as to whether the data stored in the memory cell is "0" or "1" is carried out by setting the operating point of the sense amplifier circuit, i.e., sense potential so that a suitable current flows in the memory cell. This sense potential is set to about −1 volt as indicated by the single dotted lines.

In FIG. 3, in the case of the cell of "1" data, electrons in the floating gate are discharged with the lapse of time. Thus, the threshold voltage thereof lowers with the lapse of time to reach 1 volt, which is the threshold voltage in the initial state. On the other hand, in the case of the cell of "0" data, electrons are injected into the floating gate with the lapse of time. Thus, the threshold voltage rises with the lapse of time to reach 1 volt. At the time $t_N$ in the middle thereof, that threshold voltage goes through '1 volt, which is the sense potential of the sense amplifier circuit.

FIG. 4 shows the change of the cell current ($I_{cell}$) at the time of the high temperature shelf test of the memory cell in which "0" level data is stored. With the lapse of time, the cell current decreases. When the cell current is below the sense level current Is in the sense amplifier circuit, the sense amplifier circuit erroneously judges data which has been originally at the "0" level to be "1" level data. It is only the memory cells in which "0" level data is stored, that data may be erroneously detected as stated above. The time when such an erroneous data is detected is now assumed to be $t_N$. In the case of the normal memory cell, the time required for reaching the time $t_N$ is sufficiently long, and there is therefore no problem in view of actual use. However, in the case of the defective memory cell, the time required for reaching the time $t_N$ is small. For this reason, there are instances where memory cells may become inferior or defective while they are being used in a product. Particularly, if erasing and/or writing are frequently repeated, the insulating oxide film is considerably deteriorated, so inferiority is apt to occur.

FIG. 5 is a circuit diagram of a conventional typical EEPROM in which memory cells similar to the memory cell shown by the equivalent circuit of FIG. 2 are used to constitute a cell array. The control gates of the floating gate transistors 2 of memory cells MC-11 to MC-mn are connected to control gate select lines CGL1 to CGLn selected by column decoders 5-1 to 5-n through control gate select transistors 6. Further, the gate of the control gate select transistor 6 and the gate of the select transistor 1 in each same memory cell are both connected to one of the row lines WL1 to WLm selected by the row decoder 4. Drains of the select transistors 1 in respective memory cells are connected to column lines DL1 to DLn. Respective column lines DL1 to DLn are connected in common to a bus line 8 through column select transistors 7. The gates of the transistors 7 are connected to the corresponding column decoders 5 through column select lines CL1 to CLn, respectively. To the bus line 8, a data input circuit 9 and a sense amplifier circuit 10 are connected. The data input circuit 9 outputs data of "0" or "1" level depending on a write data signal Din inputted from the outside. The sense amplifier circuit 10 detects, as "0" or "1", the level of data stored in a selected memory cell MC. At the time of sensing the data level, the sense amplifier circuit 10 applies a bias voltage necessary for the readout of data to a corresponding data line DL. Namely, the sense amplifier circuit 10 includes a bias circuit.

The data sensed at the sense amplifier circuit 10 is inputted to a data output circuit 12. Readout data is outputted from the data output circuit 12 to the outside.

In EEPROMs of such a structure, in the case where erasing/writing were conducted about $10^3$ times with a device of a memory capacity of the order of 64K bits, the possibility that there takes place random cell inferiority in every bit due to defects as described above, etc., indicates a high value of about 0.1 to 0.2%. For this reason, there was the drawback that the reliability is low, leading to limited use from a viewpoint of the practical use.

To prevent lowering of the reliability due to cell inferiority, a technique is conceivable to constitute each storage unit with two memory cells. However, the memory cell corresponding to 1 bit becomes large, resulting in that such a technique is not suitable for implementation of large capacity memory devices.

SUMMARY OF THE INVENTION

An object of this invention is to provide a high reliability non-volatile semiconductor memory device as a device having a configuration permitting the memory capacity to be large.

According to one aspect of the present invention, there is provided a non-volatile semiconductor memory device comprising: a plurality of floating gate transistors constituting non-volatile memory cells and forming a cell array or arrays substantially in a matrix form comprised of said memory cells, a plurality of data lines for transmitting data to the memory cells of respective columns of said cell array or arrays and receiving data therefrom, word lines for selecting the memory cells of respective rows of said cell array or arrays to connect selected memory cells to corresponding data lines, respectively, a column decoder for selecting said data lines, and a row decoder for selecting said word lines, a pair of memory cells of said plurality of memory cells selected by said respective word lines being connected to said respective data lines by the common junction where drains of said a pair of memory cells are commonly connected, one bit data memory unit for storing one bit data being comprised of said a pair of memory cells.

According to another aspect of the present invention there is provided a non-volatile semiconductor memory device comprising: a plurality of floating gate transistors constituting non-volatile memory cells and forming a cell array or arrays substantially in a matrix form comprised of said memory cells, a plurality of data lines for transmitting data to the memory cells of respective columns of said cell array or arrays and receiving data therefrom, word lines for selecting the memory cells of respective rows of said cell array or arrays to connect selected memory cells to corresponding data lines, respectively, a column decoder for selecting said data lines, and a row decoder for selecting said word lines, a pair of memory cells of said plurality of memory cells selected by said respective word lines being connected to said respective data lines by the common junction where drains of said pair of memory cells are commonly connected, select transistors turned ON and OFF by said word lines being provided between said common junction and the drains of said respective pair of memory cells, each one bit data memory unit being comprised of said two non-volatile memory cells and one of said select transistors.

In accordance with this invention, since the 1 bit data memory unit for storing data of 1 bit is constituted with a pair of memory cells, the reliability becomes high as a matter of course. In addition, since the drains of a pair of memory cells in the bit data memory unit are connected to a single data line at the common junction, the dimension of the memory device becomes smaller as a whole than that of the device in which the drains of a pair of memory cells are connected to different data lines, respectively. In more actual terms, the drains of a pair of memory cells are connected to a single data line through a single contact.

In a device in which a select transistor is provided between a pair of memory cells and the data line (common connection point), those pair of memory cells are selected by the word line, and the select tansistor is selected. Thus, two memory cells and the data line become conductive.

The above-mentioned select transistor may be provided for every memory cell, but only one select transistor may be provided in common to two transistors. An employment of the arrangement including one select transistor is advantageous for miniaturization.

In the case where there is employed an arrangement such that the memory cells and the select transistor are directly adjacent to each other so that there is no diffused layer therebetween, a further miniaturized memory device is realized.

As a pair of memory cells in the 1 bit data memory unit, a pair of memory cells arranged in a row direction of memory cells arranged in a matrix form, or a pair of memory cells arranged in a column direction thereof may be employed. In the former case, without provision of the field portion isolating adjacent a pair of memory cells, a certain diffused layer can be used as the drain of one memory cell of the adjacent memory cells, and can be used as the source of the other memory cell. Thus, the size in a row direction is further reduced.

By preparing a first section in which the 1 bit data memory unit is comprised of a pair of memory cells and a second section in which the 1 bit data memory unit is comprised of a single memory cell, high reliability can be attained while preventing an unnecessary increase in the cell area. In this case, there may be employed an arrangement such that the first and second sections exist within the same memory array, thus permitting the bit line to be common to both sections. In contrast, in the case where both sections are constructed to exist within different memory cell arrays, respectively, bit lines for both sections differ from each other as a matter of course.

When there is employed an arrangement such that a voltage less than a threshold voltage of the memory cell is applied to the drain thereof at the time of readout, even if the memory cell is destroyed, so its floating gate short-circuits with the drain, that memory cell is turned OFF at all times irrespective of initial storage data. For this reason, even if a memory cell in which "1" data is stored to allow a current not to flow is destroyed, a current can be prevented from flowing in the same manner as stated above. Thus, data errors can be prevented.

BRIEF DESCRIPTION OF THE DRAWINGS

In the accompanying drawings:

FIG. 8 is a diagram showing a partial plan pattern view of a first embodiment according to this invention;

FIG. 9 is a cross sectional view taken along the A—A line of FIG. 8;

FIG. 10 is an equivalent circuit diagram of the first embodiment shown in FIG. 8;

FIG. 17 is a diagram showing a partial plan pattern view of a third embodiment according to this invention;

FIG. 18 is an equivalent circuit diagram of the third embodiment shown in FIG. 17;

FIG. 22 is a partial cross sectional view of a fifth embodiment according to this invention;

FIG. 23 is a partial cross sectional view of a sixth embodiment according to this invention;

FIG. 24 is a cross sectional view taken along the line A—A of FIG. 23;

FIG. 25 is an equivalent circuit diagram of the sixth embodiment shown in FIG. 23;

FIG. 29 is a circuit diagram showing the entirety of a ninth embodiment according to this invention;

DESCRIPTION OF THE PREFERRED EMBODIMENTS

The development of which various embodiments of this invention are provided will be first described with reference to the attached drawings.

Figure 1:
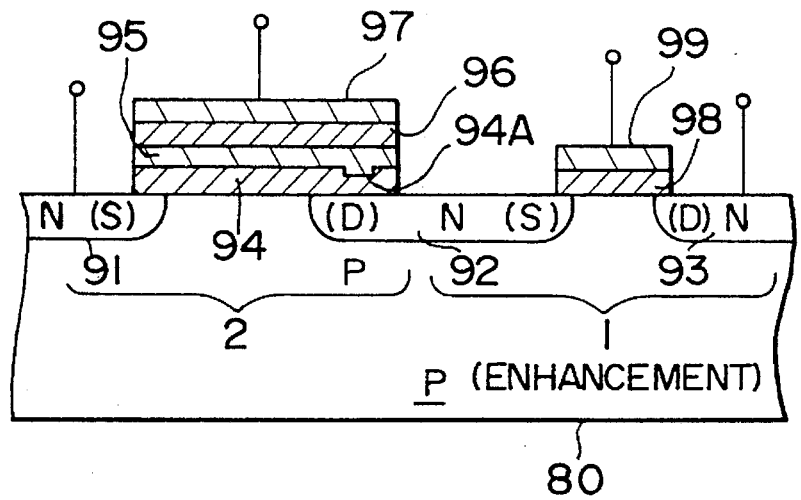
FIG. 1 is a cross sectional view of a memory cell in the prior art.
Figure 2:
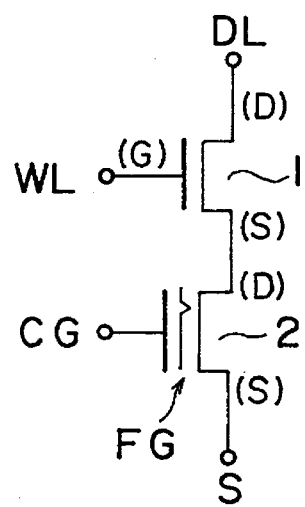
FIG. 2 is an equivalent circuit diagram of the memory cell shown in FIG. 1.
Figure 3:
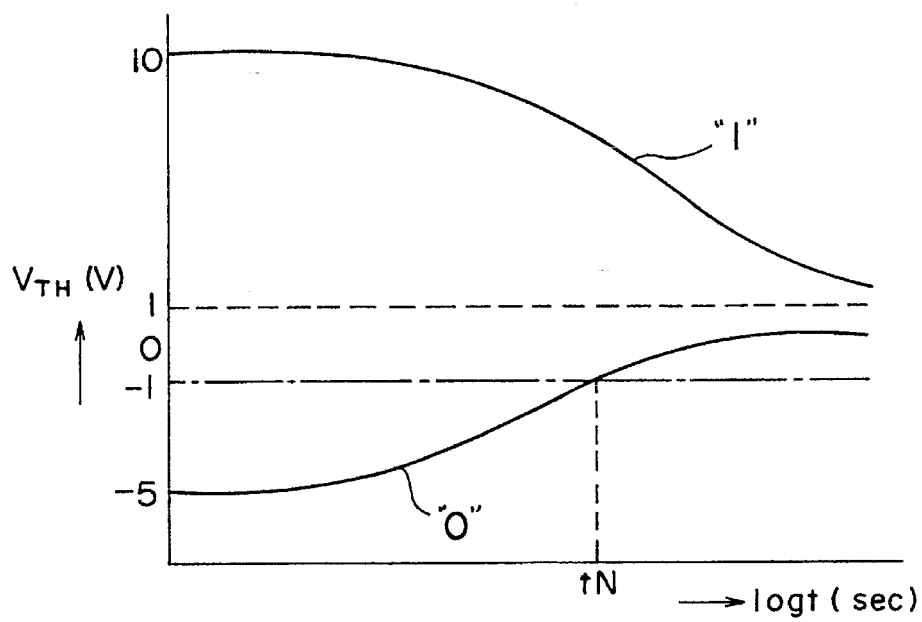
FIGS. 3 and 4 are characteristic diagrams of the memory cell shown in FIG. 1.
Figure 4:
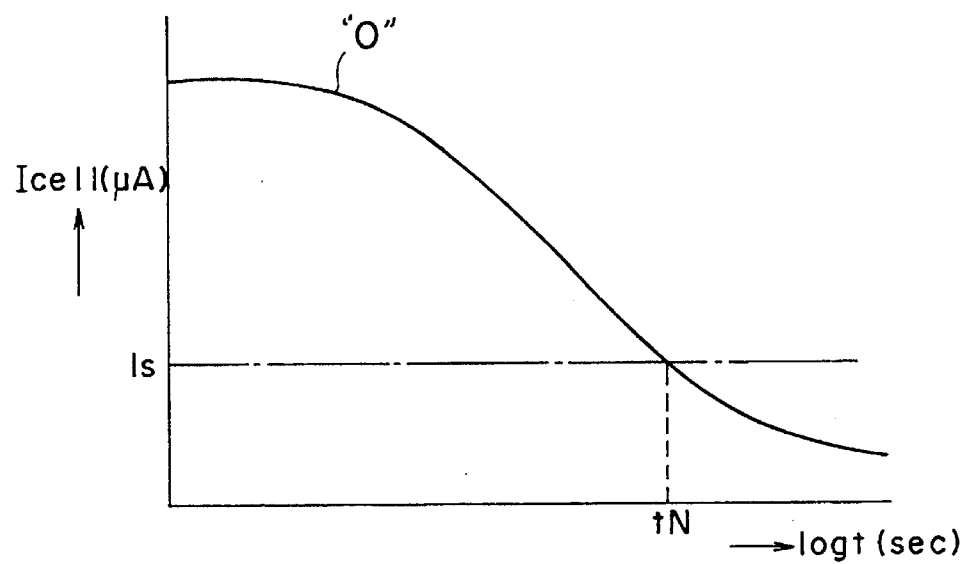
Figure 6:
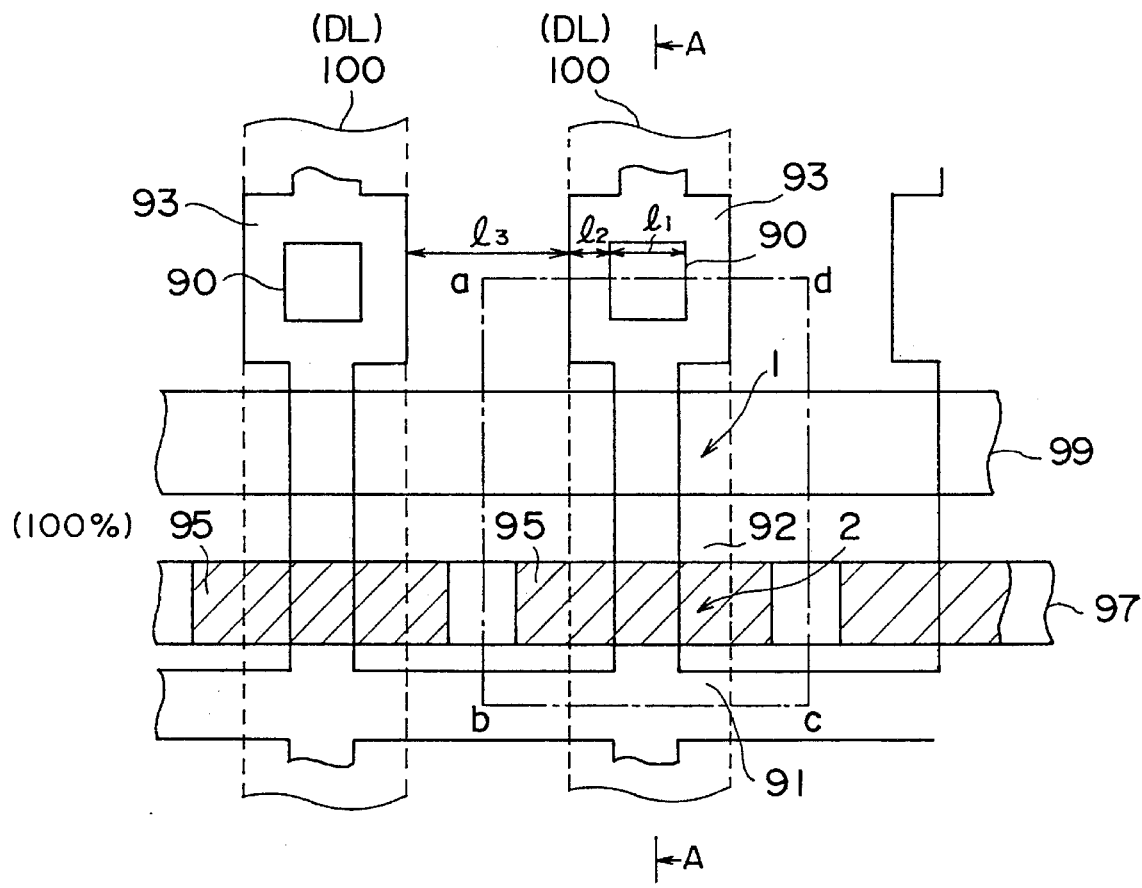
FIG. 6 is a diagram showing the plan pattern view of a memory cell according to this invention.
Figure 7:
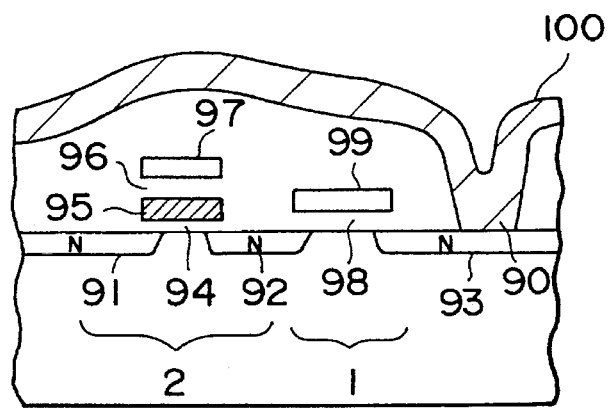
FIG. 7 is a cross sectional view taken along the A—A line of FIG. 6.

Initially, referring to FIGS. 6 and 7, there is shown a portion of an EEPROM (a unit cell, 1 bit data memory unit) according to this invention, constructed so that memory cells can be miniaturized to a greater degree. FIG. 6 shows a plan view of an actual arrangement, with the section encompassed by single-dotted lines a, b, c and d representing a unit memory cell. FIG. 7 is a cross sectional view taken along the A—A line of FIG. 6. The configuration shown in FIG. 7 differs from the configuration shown in FIG. 1 in that the insulating oxide film 94 of the floating gate transistor 2 is formed as a thin film of 100 angstroms, and that the thin film portion 94A of FIG. 1 for allowing a tunnel current to flow therein is omitted. In FIGS. 6 and 7, the same reference numerals are attached to parts similar to those in FIG. 1, respectively.

Since such a configuration is employed, the size in a thickness direction of the floating gate transistor 2 can be reduced to a large degree. However, the size in a lateral direction is determined, as seen from FIG. 6, by the contact portion 90. Namely, by the size $l_1$ of the contact 90, the margin $l_2$ between the contact 90 and the drain n$^+$ diffused layer 93, and the size $l_3$ of the field isolation portion between adjacent drain n$^+$ diffused layer 93, the size of the cell is determined. These sizes are fixed in the manufacturing process determined in advance. For this reason, it is difficult in practice to arbitrarily reduce these respective sizes. In view of this, even when an attempt is made to use two (a pair of) memory cells of FIGS. 6 and 7 to construct the above-mentioned high reliability non-volatile semiconductor memory (1 bit data memory unit), the chip size becomes large also in this case. Accordingly, it is considered difficult to realize a large capacity memory device.

This invention has been made on the basis of the configuration of FIGS. 6 and 7, and an embodiment thereof is shown in FIG. 8. The configuration of FIG. 8 differs from that of FIG. 6 in that a single contact is formed in common to two (a pair of) cells of the NAND structure of the cell including transistors 1A and 2A and the cell including transistors 1B and 2B. Its equivalent circuit is shown in FIG. 10. When provision of a single contact 90 is employed, the size in a lateral direction of the memory cell is not determined by the contact portion 90, but is determined by the width $W_1$ of the floating gate 95 and the distance $W_2$ between the floating gates 95 and 95. Namely, since the size in a lateral direction of the cell is determined by the minimum dimension required for stable process of the floating gate 95, the size of the entirety of the device is reduced to a large degree. When comparison of the dimension with respect to an actual memory cell is made, the area of the memory cell (1 bit data memory unit) encompassed by the dotted lines a, b, c and d of FIG. 8 is reduced to about 70% of the area in the case of the structure comprised of two memory cells shown in FIG. 6. The cross section taken along the A—A line of FIG. 8 is shown in FIG. 9.

The operation of the memory cell of FIGS. 8 to 10 will now be described.

TABLE 1

| Operational mode | $V_{WL}$ | $V_{CG}$ | $V_S$ | $V_{DL}$ | $V_{FG}$ | State of floating gate |
|---|---|---|---|---|---|---|
| Erase ("1") | H | H | 0V | 0V | H | Electrons are injected from drain into floating gate |
| Write ("0") | H | 0V | H | H | L | Electrons are discharged from floating gate into drain |
| Write ("1") | H | 0V | H | 0V | L | No movement of electrons |
| Readout | 5V | 0V | 0V | 1V | — | — |

Table 1 shows the operational mode of the memory cell indicated by the equivalent circuit of FIG. 10. In this memory cell, there are four operational modes of: ① the erase mode, ② "0" write mode, ③ "1" write mode, and ④ readout mode. These operational modes will now be described below.

① Erase mode

When the word line WL and the control gate CG are both in a selected state, high potentials H (e.g., 20 volts) are applied to the word line WL and the control gate CG as potentials $V_{WL}$ and $V_{CG}$, respectively, and a potential of zero volts is applied to the data line DL. At this time, the potential $V_{FG}$ on the floating gate FG becomes a high potential H (e.g., about 12 volts) by the capacitive coupling between the floating gate FG and the control gate CG. Further, since the select transistor 1 is in an ON state, and the potential on the drain of the floating gate transistor 2 is equal to zero volts, electrons are injected from the drain of the floating gate transistor 2 into the floating gate FG through the thin film portion 94 in FIG. 9 by the tunnel effect of the Fowler-Noldheim. This operation is called a data erasing operation. Data after erasing is assumed to be at "1" level.

②, ③ write mode of data "0" and "1"

In both modes, the potential $V_{WL}$ on the word line WL is caused to be a high potential H, the potential $V_{CG}$ on the control gate CG is caused to be zero volts, and the potential $V_S$ on the source S is caused to be a high potential H (e.g., 5 volts). More particularly, when the operational mode is the "0" write mode, the potential $V_{DL}$ on the data line DL is caused to be a high potential H (data input "0"). The floating gate FG is caused to have a low potential L by the capacitive coupling between the floating gate FG and the control gate CG. In this case, by the tunnel effect of Fowler-Noldheim, electrons are discharged from the floating gate FG of the floating gate transistor 2 into the drain through the thin film portion 94. This operation is called a "0" write operation.

On the other hand, when the operational mode is the "1" write mode, the potential $V_{DL}$ on the data line DL is caused to have zero volts (data input "1"). Further, the floating gate FG has substantially no potential difference between the floating gate FG and the control gate CG, resulting in substantially zero volts. In this case, there is no movement of electrons. Thus, in the case where electrons were previously injected into the floating gate FG, so there results the state of data "1", that state is maintained. This operation is called a data "1" write operation.

④ Data readout mode

The potential VWL on the word line WL is caused to be 5 volts, the potential $V_{DL}$ on the data line DL is caused to be equal to about 1 volt, and the potential $V_{CG}$ on the control gate CG is caused to be equal to zero volts. Thus, ON/OFF of the floating gate transistor 2 is determined in dependency upon the kind of charges stored (electrons or positive holes) into the floating gate FG.

It is now assumed that data "1" is stored in the memory cell. Namely, it is assumed that electrons are injected into the floating gates 95 and 95 of the two transistors 2A and 2B, respectively, and that the threshold values of these transistors 2A and 2B are 10 volts. Under this state, no current flows in either of the two transistors 2A and 2B at the time of readout.

Further, it is assumed that data "0" is stored in the memory cell. Namely, if positive holes are injected into the floating gates 95 and 95 of the two transistors 2A and 2B, the threshold values of the floating gate transistors 2A and 2B becomes equal to, e.g., −5 volts. Thus, the two transistors 2A and 2B are both turned ON at the time of readout. As a result, a current flows in the transistors 1A, 2A; 1B, 2B through the data line DL. Such a data readout operation is conducted at the sense amplifier circuit operative based upon whether or not there is a cell current.

It is now assumed that there is a defect in the oxide film 94, etc., of one transistor 2A, so positive holes are discharged resulting in negative level in the floating gate 95. At this time, if the storage data is "1", electrons are discharged from the floating gate 95. As a result, the threshold value of the transistor 2A becomes equal to 1 volt of an initial value. However, since the control gate CG has zero volts, the transistor 2A is maintained in an OFF state. For this reason, no erroneous operation takes place. In contrast, if the storage data is "0", positive holes are discharged from the floating gate 95. As a result, the threshold value changes from −5 volts to 1 volt in the same manner as stated above. Thus, the transistor 2A is turned OFF. However, the threshold value of the other normal transistor 2B still remains at −5 volts. For this reason, a current flows in the data line DL through the transistor 2B, so that no erroneous operation takes place.

As stated above, even if one of two transistors, e.g., the transistor 2A becomes inferior or poor, as long as the other transistor 2B is normal, the memory cell can perform a normal operation as a whole.

Figure 5:
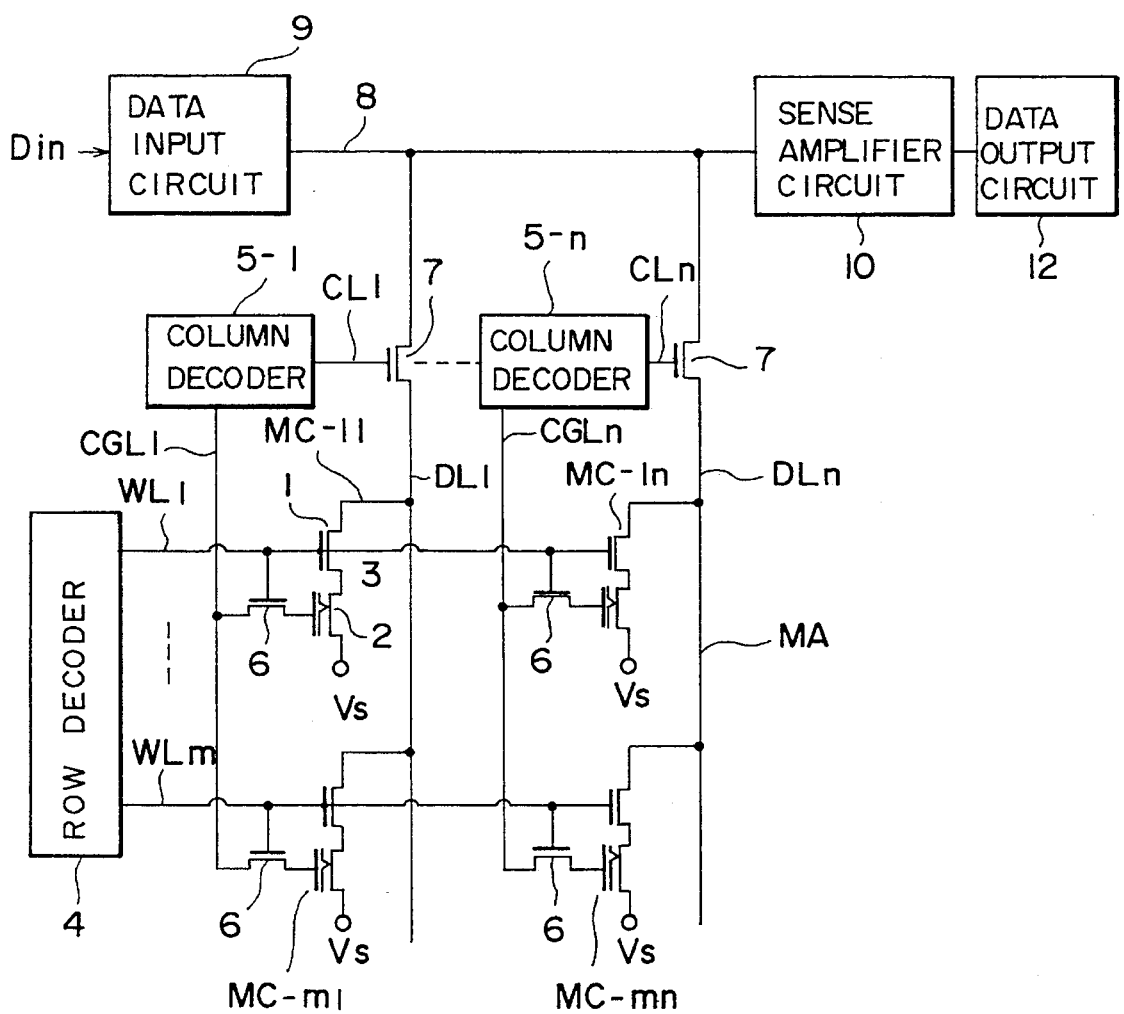
FIG. 5 is a circuit diagram showing the entirety of a conventional device.
Figure 11:
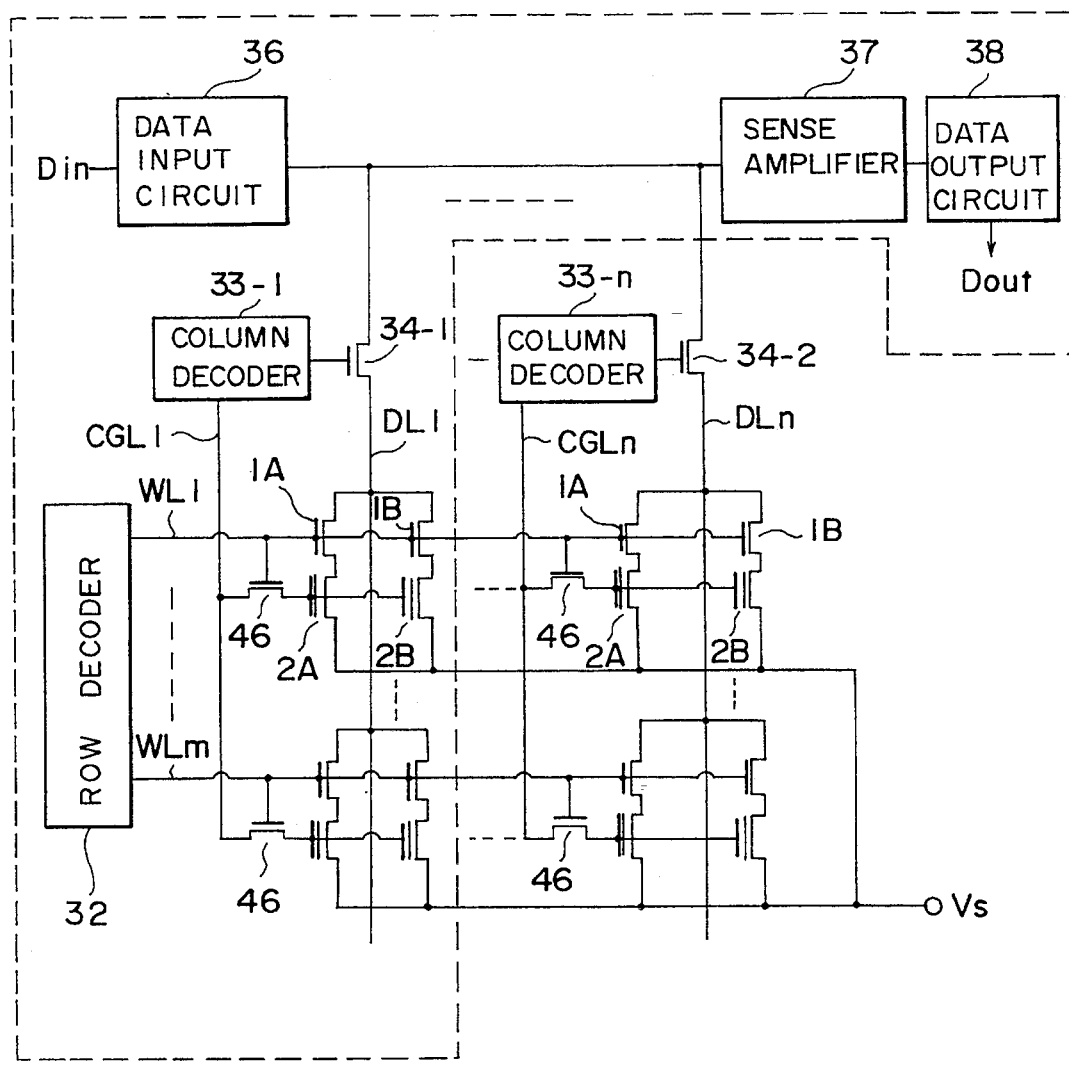
FIG. 11 is a circuit diagram showing the entirety of a memory device according to this invention.
Figure 12:
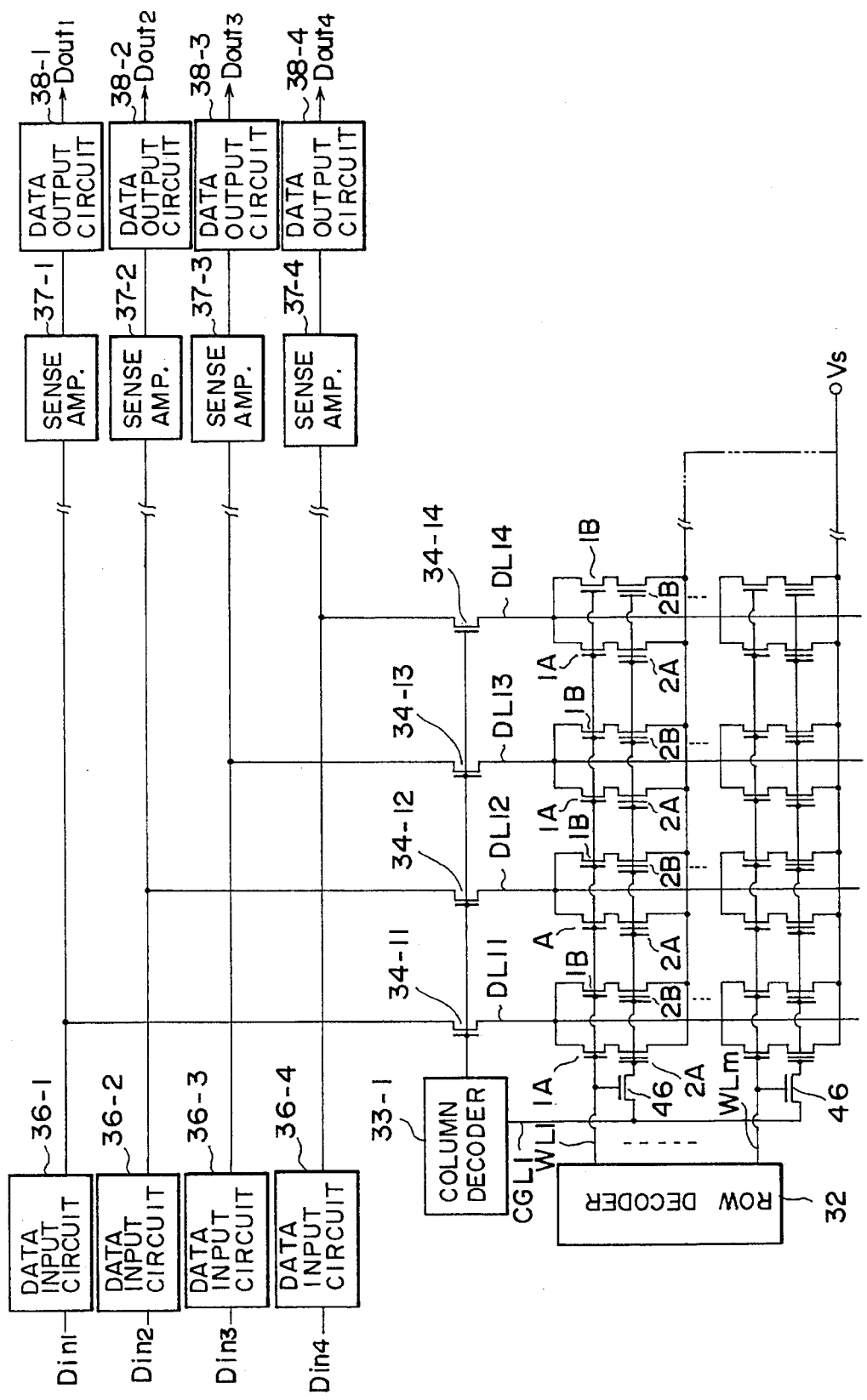
FIG. 12 is a circuit diagram showing an example of a semiconductor memory device of the four bit type.

FIG. 11 is a circuit diagram showing the configuration of a memory cell of one bit type wherein the one bit memory unit of the prior art shown in FIG. 5 is replaced by that in FIG. 10. This circuit may be readily of a structure of the multi-bit type. FIG. 12 shows a memory cell of the four bit type of the section corresponding to the section encompassed by broken lines of FIG. 11. When such a configuration is employed, input/output of 4 bit data may be carried out.

Figure 13:
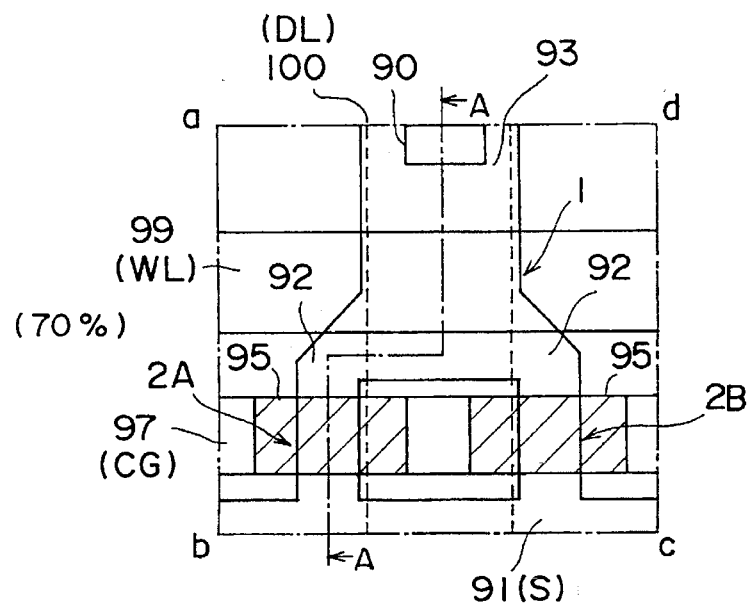
FIG. 13 is a diagram showing a partial plan pattern view of a second embodiment according to this invention.
Figure 14:
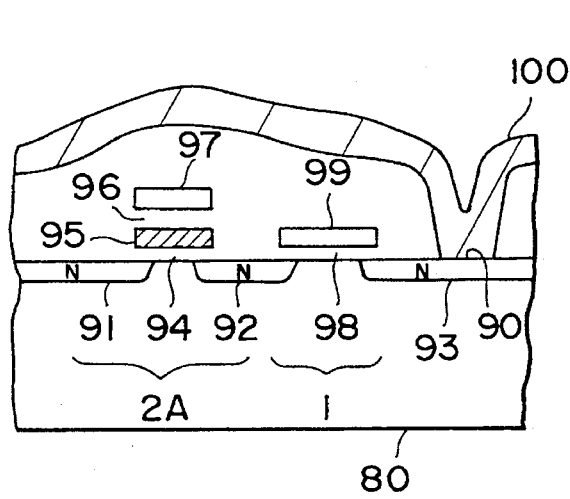
FIG. 14 is a cross sectional view taken along the A—A line of FIG. 13.
Figure 15:
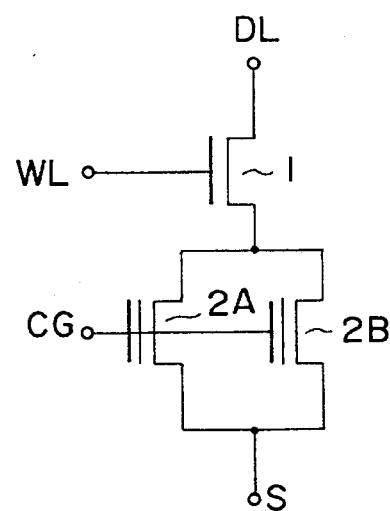
FIG. 15 is an equivalent circuit diagram of the second embodiment shown in FIG. 13.
Figure 16:
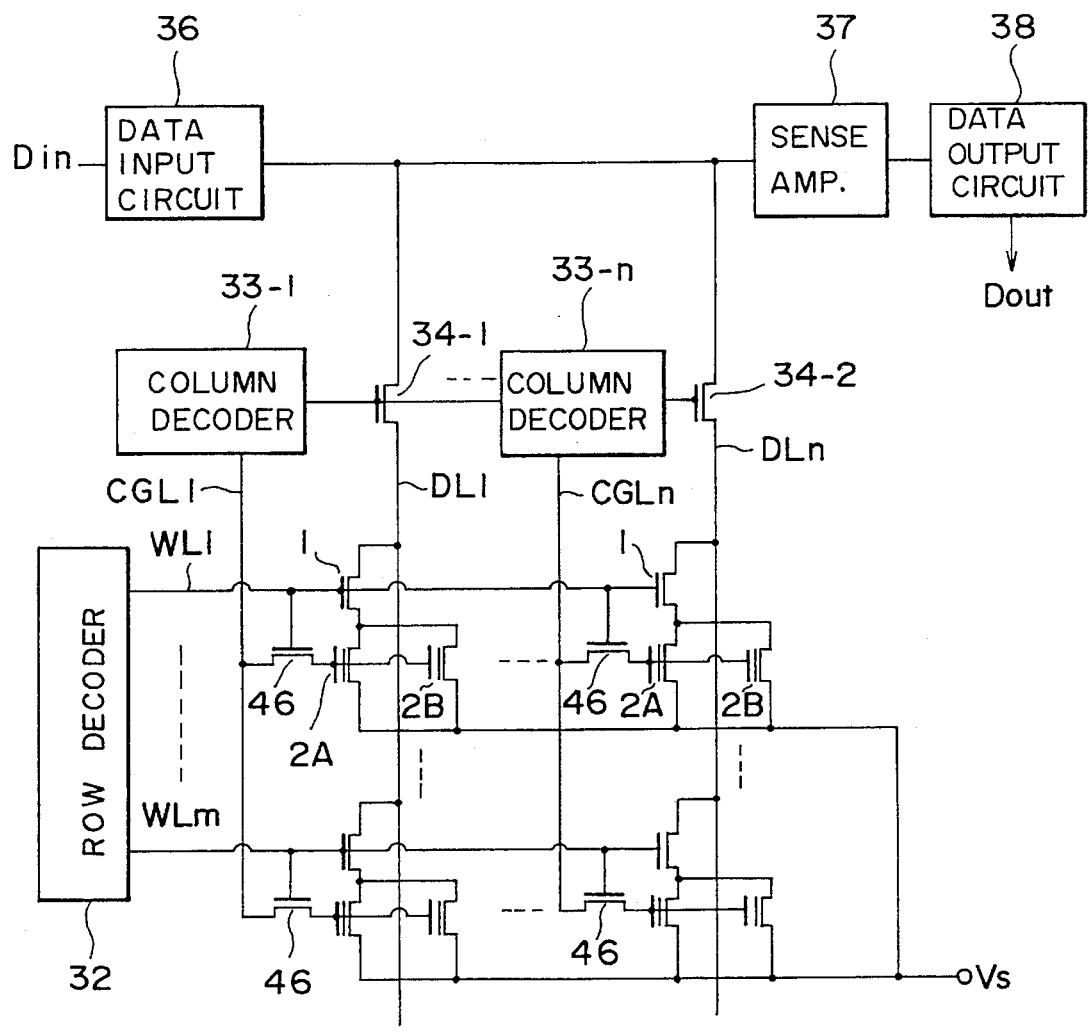
FIG. 16 is a circuit diagram showing the configuration of EEPROM.

Referring to FIGS. 13 to 16, there is shown a second embodiment of this invention. FIG. 13 shows the section (1 bit data memory unit) corresponding to the section encompassed by broken lines a, b, c and d of FIG. 8. The configuration of FIG. 13 differs from the configuration of FIG. 8 in that only one select gate transistor is provided. When such a configuration is employed, the area of the N-type diffused layer region 93 adjoining the data line DL can be reduced as shown in FIG. 13. Thus, the parasitic capacitance of the diffused layer 93 is reduced, so the charge/discharge rate of the data line DL becomes fast. Thus, high speed operation can be attained. The memory size in the case of FIG. 13 becomes equal to that of FIG. 8. FIG. 14 is a cross sectional view taken along the A—A line of FIG. 13. FIG. 15 is an equivalent circuit of FIG. 13, and FIG. 16 is a circuit diagram showing the configuration of EEPROM.

Referring to FIGS. 17 and 18, there is shown a third embodiment of this invention. In this embodiment, a memory cell suitable for miniaturization is shown. The embodiment of FIG. 17 differs from the embodiment of FIG. 13 in that the common source of two floating gate transistors 2A and 2B is separated into two sources $S_A$ and $S_B$. Two source interconnections (Al) for two sources $S_A$ and $S_B$ are required from a viewpoint of layout of the drawing. However, sources $S_A$ and $S_B$ may be connected to the same source line. When such a configuration of FIG. 17 is employed, the memory cell size becomes equal to 63% of that in FIG. 6. Namely, the memory cell size can be reduced to a great extent.

Figure 19:
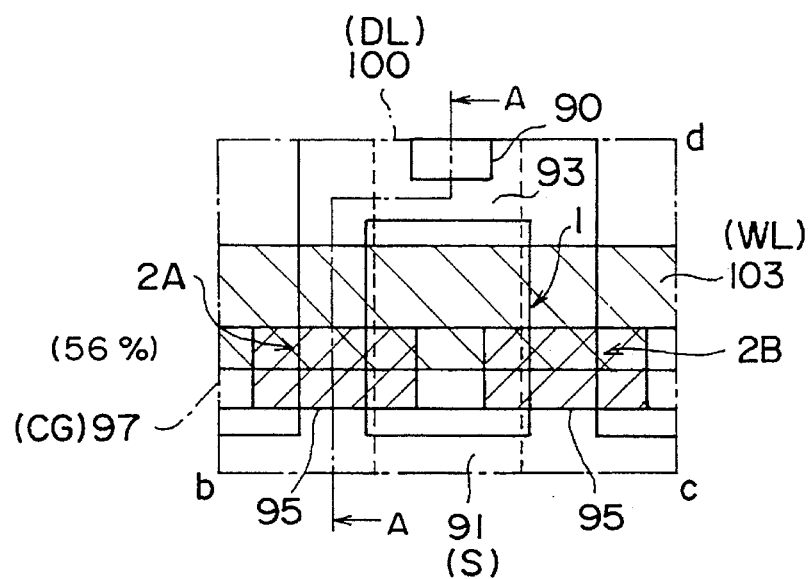
FIG. 19 is a diagram showing a partial plan pattern view of a fourth embodiment according to this embodiment.
Figure 20:
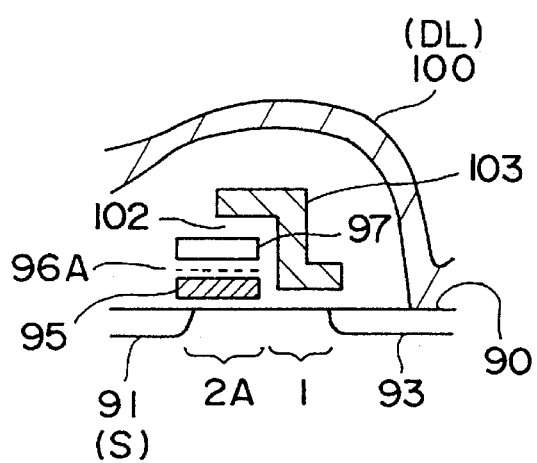
FIG. 20 is a cross sectional view taken along the A—A line of the fourth embodiment shown in FIG. 19.
Figure 21:
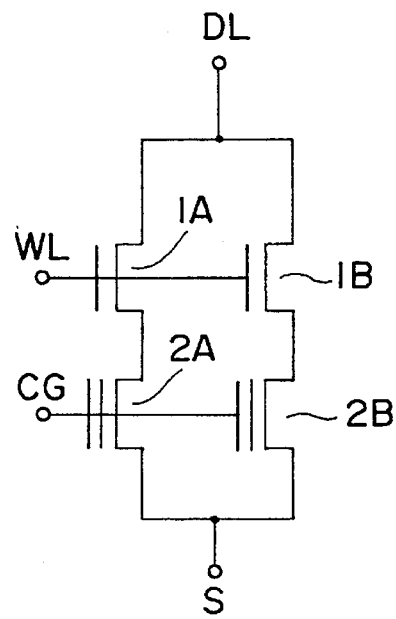
FIG. 21 is an equivalent circuit diagram of the fourth embodiment shown in FIG. 19.

Referring to FIGS. 19 to 21, there is a fourth embodiment according to this invention. In this embodiment, a polycrystalline silicon layer of the third layer is used to thereby permit the memory cell size to be further miniaturized. Namely, particularly as seen from FIG. 20, a floating gate 95 is formed by the polycrystalline silicon of the first layer, and a control gate 97 is formed by the polycrystalline silicon of the second layer. An insulating film 102 is then formed. Thereafter, a select gate 103 serving as the word line is formed by the polycrystalline silicon of the third layer. When such a configuration is employed, the diffused layer 92 between the floating gate transistor 2 and the select transistor 1 in FIG. 6 can be eliminated. The cell size can be reduced to an extent such that the diffused layer 92 can be eliminated. Namely, the memory cell size can be reduced to 56% of that in FIG. 6. Further, as seen from FIG. 20, an N-layer 96A is provided between the floating gate 95 and the control gate 97, thus allowing the insulating film to be of a triple layer structure of O-N-O (Oxide-Nitride-Oxide). Since such a triple layer structure is employed, even if the insulating film between two gates 95 and 97 is allowed to be thin, it is possible to set the insulating withstand voltage to a higher value. The equivalent circuit of FIG. 19 is shown in FIG. 21.

FIG. 22 shows a fifth embodiment as a modified example of FIG. 20 along the same cross section. In FIG. 20, at the time of forming the control gate 97, the floating gate 95 is etched subsequently to form gate 97 by using the gate 97 as a mask. As a result, the floating gate 95 is formed so that it has substantially the same size as that of the gate 97. Thereafter, when the select gate 103 of the third layer is formed, the select gate 103 and the floating gate 95 directly face each other. For this reason, there is the possibility that the withstand voltage between the floating gate 95 and the select gate 103 may be deteriorated depending upon the circumstances. The modified example shown in FIG. 22 contemplates improving the above problem. A floating gate 95 is first formed, and a control gate 97 is then formed so as to sufficiently cover the floating gate 95. In this figure, reference numerals 91A and 92A denote N-type diffused layers, respectively. These layers may have a concentration somewhat lower than that of the diffused layer 91 and 93. When such a configuration is employed, the floating gate 95 is perfectly covered with the insulating film of O-N-O. Thus, the withstand voltage between the floating gate 95 and the select gate 103 is improved, and the reliability is also improved.

The above-described inferior or poor mode where the mode charges in the floating gate dissipates due to a current leakage caused by deterioration and/or defect of an insulating oxide film, between the floating gate 95 and the semiconductor substrate 80. However, in the case where the deterioration takes place to a large degree, if the (Write/Read) operation is repeated, the memory cell may be broken. At the time of complete breakage, the floating gate 95 and the drain 92 would be completely short-circuited. Thus, the potential on the floating gate 95 becomes equal to the potential on the drain 92 irrespective of the potential on the control gate 97. Even if such an unsatisfactory or inferior state occurs, when an approach is employed to set the voltage on the drain 92 at the time of the read operation to a value of less than 1 volt, this invention can provide the same effect. Namely, the initial threshold value of a broken cell is 1 volt. For this reason, if the drain voltage at the time of readout operation is set to a value of less than 1 volt, the broken cell is in an OFF state at all times at the time of readout operation. For this reason, the effects with the memory cell according to this invention can be exhibited.

Referring to FIGS. 23 to 25, there is shown a portion of a sixth embodiment (EEPROM) adapted so that the 1 bit data memory unit can be constituted with a single transistor, and be suitable for miniaturization. The memory device shown in FIGS. 23 to 25 is equivalent to the memory device in which the select transistor 1 in FIGS. 6 and 7 is omitted, and includes only the floating gate transistor 2 as the transistor. FIG. 24 is a cross sectional view taken along the A—A line of FIG. 23 and FIG. 25 is an equivalent circuit of FIG. 23.

The operation of this embodiment will now be described.

At the time of the write operation, a high voltage (e.g., 7 volts) is applied to the drain D, a voltage of zero volts is applied to the source S, and a high voltage (e.g., 12 volts) is applied to the control gate CG. Thus, electrons are generated by the hot electron effect. The electrons thus generated are injected into the floating gate. Thus, the threshold value of this transistor shifts to a positive direction, and becomes equal to, e.g., 8 volts.

At the time of the erase operation, the drain D is placed in a floating state, and a low potential (e.g., zero volts) is applied to the control gate CG and a high voltage (e.g., 12 volts) is applied to the source S. Thus, electrons in the floating gate are discharged into the source S by the tunnel effect of Fowler-Nordheim. As a result, the threshold value of this transistor shifts to a negative direction. In this case, if erasing is carried out too much, the threshold value takes a negative value. For this reason, it is required to stop erasing at a reasonable time point. Ordinarily, the threshold value after erasing is set to a value between 0 to 5 volts. Preferably, the threshold value is set to about 1 to 2 volts. Ordinarily, in the case of the memory of such a type, since the sources are commonly connected, a plurality of memory cells are simultaneously erased.

At the time of the readout operation, a voltage of about 1 volt is applied to the drain D, a voltage of zero volts is applied to the source S, and a voltage of 5 volts is applied to the control gate CG. At this time, if the cell is in a write state, this transistor is turned OFF. As a result, no current flows. On the other hand, if the cell is in an erase state, the transistor is turned ON. As a result, the current flows. This current is sensed by the sense amplifier. The data stored therein is thus read out.

While such a memory cell is suitable for miniaturization, it is required to simultaneously erase a plurality of memory cells (all memory cells in the chip according to the circumstances) at the time of erase operation and provide control such that its threshold value is equal to a fixed value. However, when a tunnel current flows in the oxide film at the time of erase operation, there might be an unsatisfactory operation in which electrons are trapped by defect, etc. in the oxide film, so the erasing characteristic is deteriorated by repetition of writing and/or erasing (W/E). In most cases, such an unsatisfactory operation may take place with a certain probability in an eventual manner. At the initial stage where, e.g., about 10,000 times of W/E are carried out, about 1 to several bits may be unsatisfactorily erased in the case of 1M bit memory.

Figure 26:
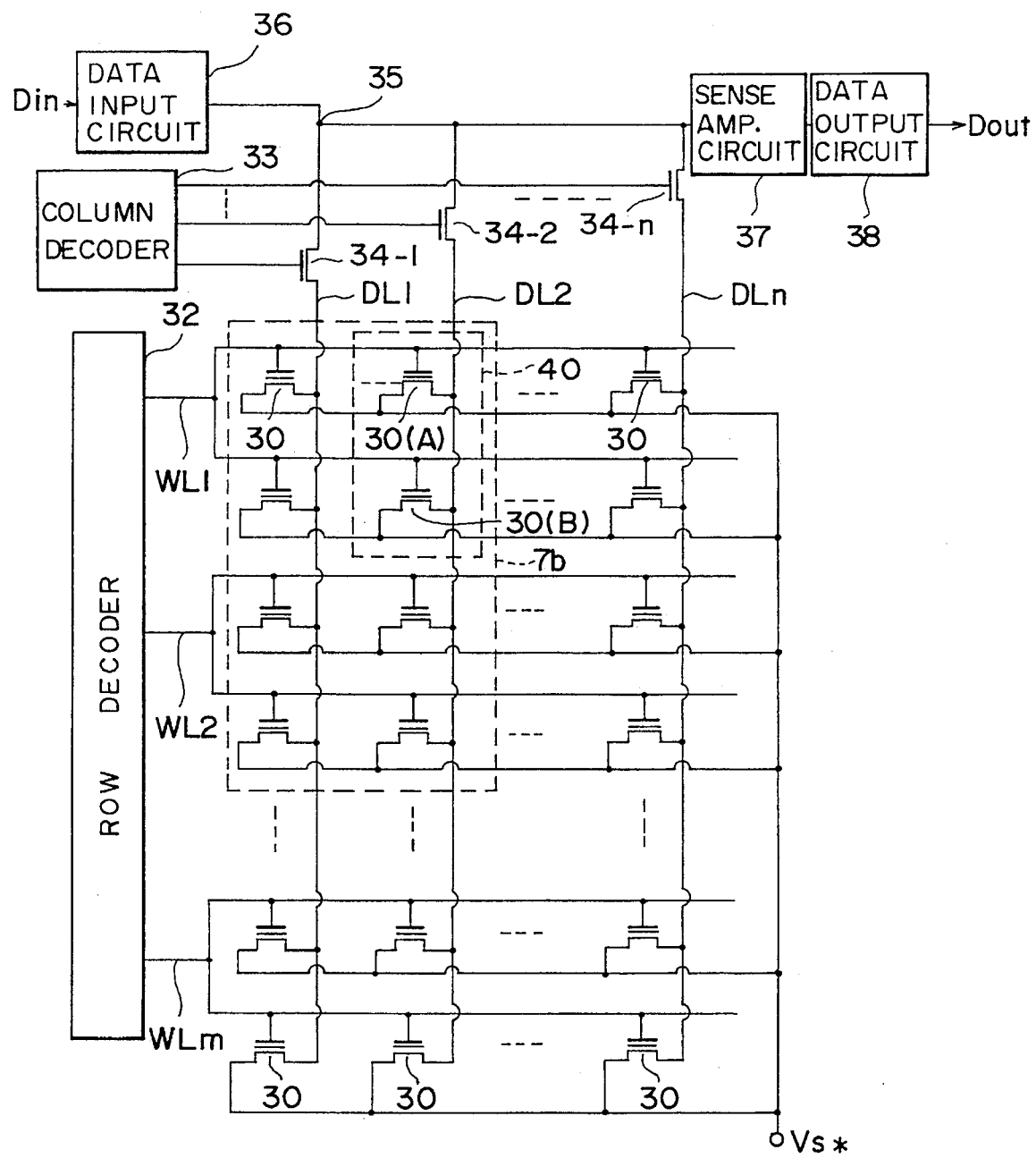
FIG. 26 is a circuit diagram showing the entirety of a seventh embodiment according to this invention.

FIG. 26 shows the entirety of the EEPROM of a seventh embodiment in which the cell shown in FIGS. 23 to 25 is used to improve such an unsatisfactory erasing. In this embodiment, respective 1 bits are comprised of two memory cells 30A and 30B as indicated by the broken lines 40. When such a configuration is employed, even if one memory cell is erased unsatisfactorily, the other memory cell is normally erased. For this reason, also in simultaneously erasing the entire memory cells of the chip, all memory cells are uniformly erased. In the embodiment shown in FIG. 26, the common source VS* is provided commonly to all the cells. However, there may be employed an arrangement such that this memory cell array is divided into a plurality of blocks to provide common sources to respective blocks to carry out erasing of all of the blocks.

Figure 27:
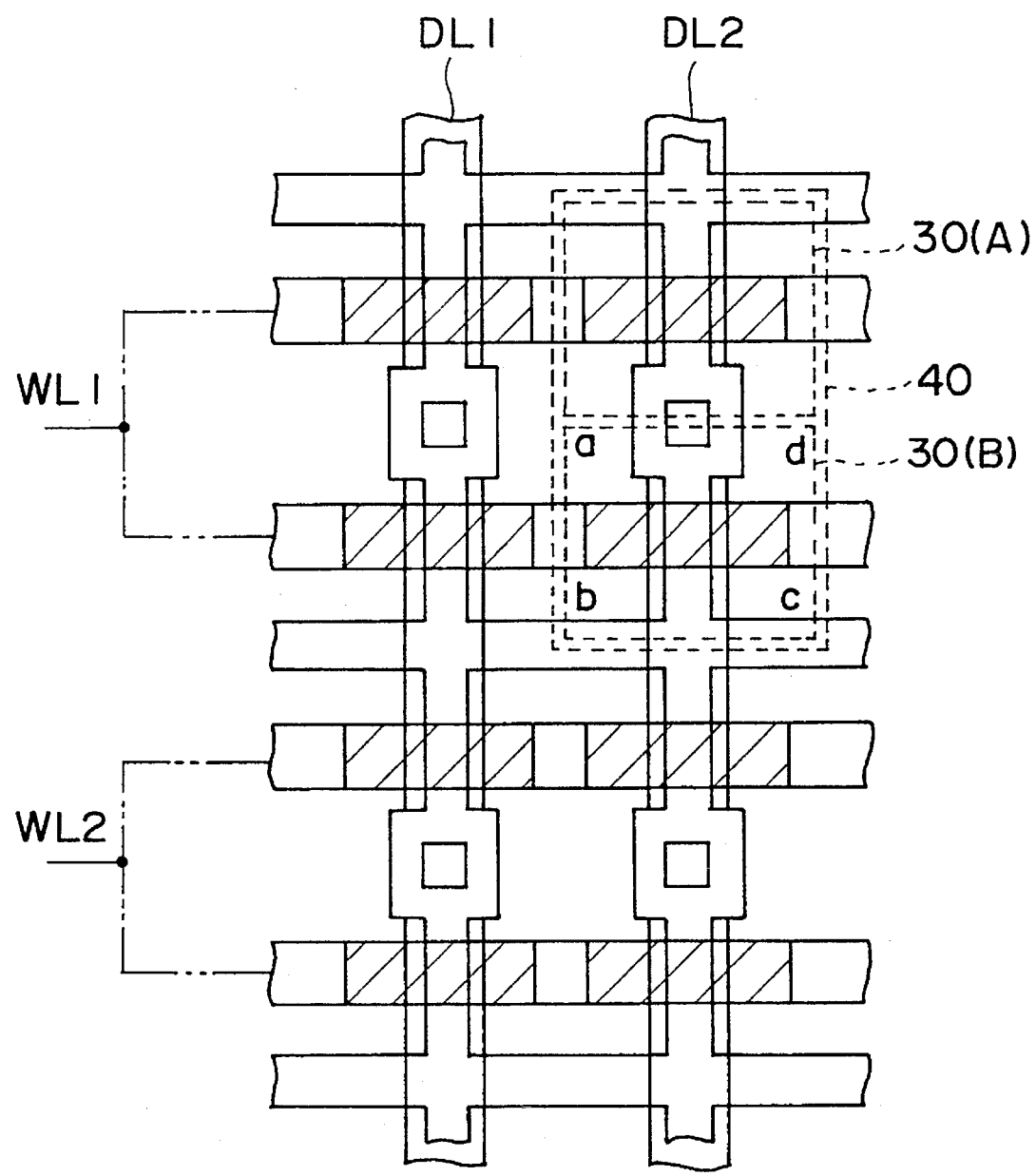
FIG. 27 is a partial plan view of the seventh embodiment shown in FIG. 26.

FIG. 27 is a diagram showing the plane pattern as an actual example of FIG. 26, and corresponds to the section 7b of FIG. 26. In FIGS. 27 and 26, the same reference numerals are attached to the same members, respectively. Further, the reference symbols a, b, c and d correspond to the reference symbols a, b, c and d of FIG. 23, respectively.

Figure 28:
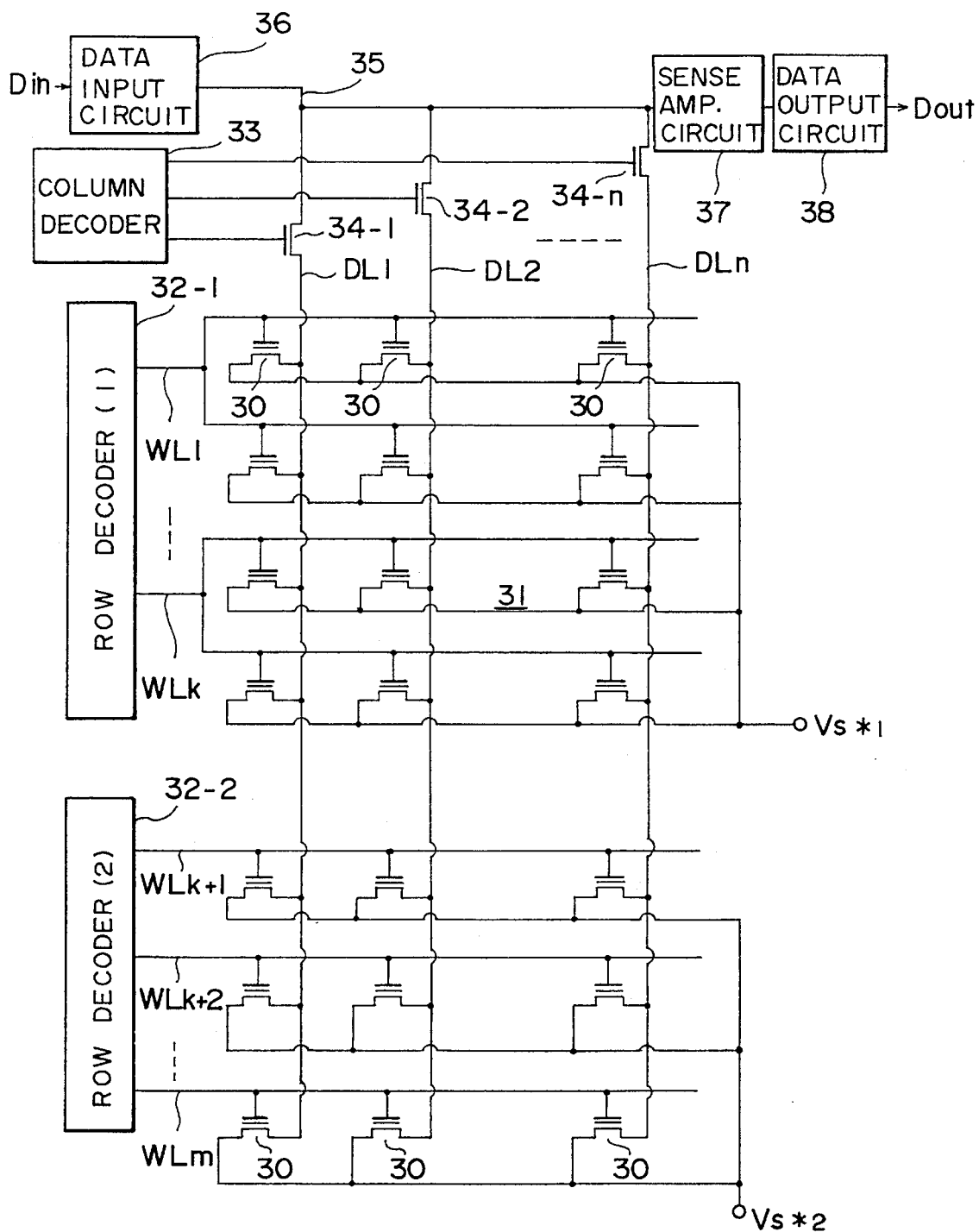
FIG. 28 is a circuit diagram showing the entirety of an eighth embodiment according to this invention.

An eighth embodiment as a modified example of the embodiment of FIG. 26 is shown in FIG. 28.

In this embodiment, the memory cell array is divided into the first section connected to word lines WL1 to WLk and the second section connected to word lines WL (K+1) to WLm. A first row decoder 32-1 for selecting word lines $WL_1$ to WLk, and a second row decoder 32-2 for selecting word lines WL (K+1) to WLm are separately provided. Further, in the first section, in the same manner as in the embodiment of FIG. 26, the 1 bit data memory unit is comprised of two cells to constitute a high reliability memory area. On the other hand, the second section is formed as the ordinary memory area where the 1 bit data memory unit is comprised of a single cell. It can be said that this configuration is such that the 2 cell/bit structure is applied only to the area for which high reliability of W/E is required. For this reason, an increase in the chip area can be held down to a minimum value while improving the reliability.

While the common source is separated into two sources VS*1 and VS*2 in this emboidment, such sources may be a single common source. In addition, the data lines DL are common in this embodiment. However, in the case where any one of memory cells shown in, e.g., FIGS. 8 to 21 is used, the pitches in a lateral direction of the memory cells of the first and second sections are different from each other. For this reason, it is preferable to completely separate the array at the first and second sections to separately provide row decoders and column decoders at the separated portions, respectively.

A ninth embodiment is shown in FIG. 29. In FIG. 29, memory cells arranged in a row direction are all connected in left and right directions wherein a pair of memory cells adjacent in left and right directions are assumed as a 1 bit data memory unit.

Namely, in FIG. 29, memory cells arranged in a row direction are successively connected in series. Namely, the drain D of a memory cell 30-1 and the drain D of a memory cell 30-2 on the left side thereof are connected, and the source S of the memory cell 30-1 and the source S of a memory cell on the right side thereof are connected. Namely, when attention is drawn to two arbitrary adjacent memory cells, the drain of one cell and the drain of the other cell are connected to each other. On the other hand, when attention is drawn to the other adjacent two memory cells, the source of one cell and the source of the other cell are connected to each other. Further, data lines DL1 to DLn are connected to the drains D of respective memory cells, and common sources S*1 to S* (n+1) are connected to the sources S thereof. These common sources S*1 to S* (n+1) are further connected to the common source VS*. Thus, a pair of left and right memory cells 30-1 and 30-2 constitute a 1 bit memory cell illustrated as a section encompassed by broken lines 40 in the figure.

Figure 30:
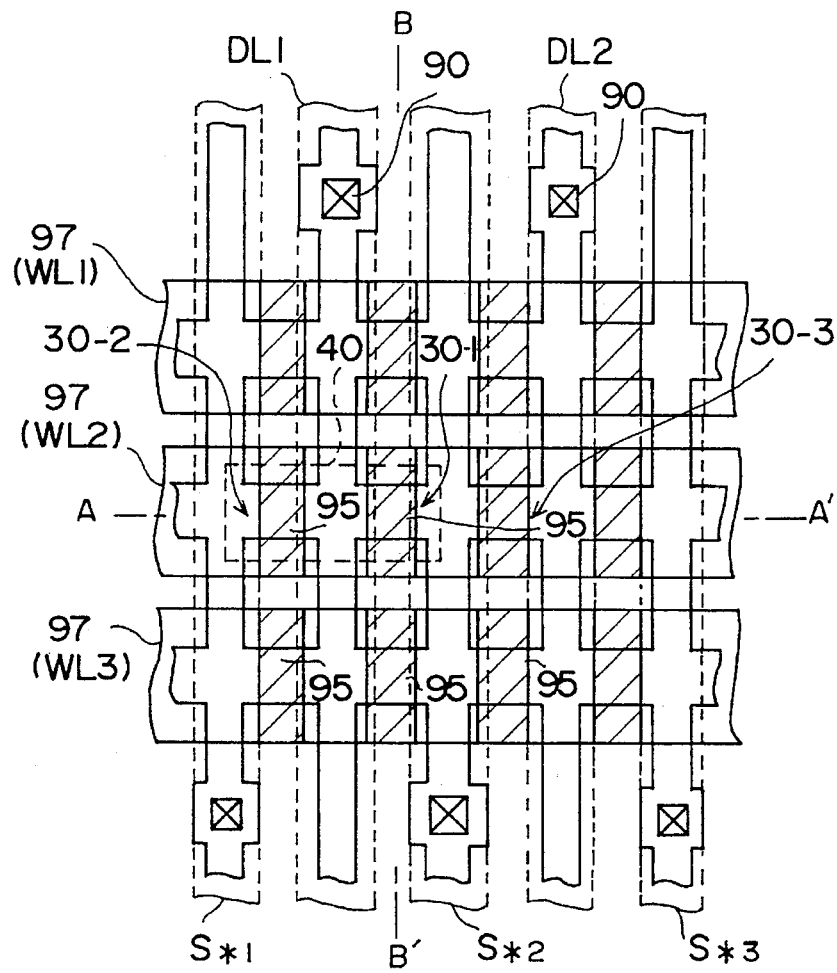
FIG. 30 is a diagram showing a partial plan pattern view of an actual device constructed on the basis of the ninth embodiment shown in FIG. 29.
Figure 31:
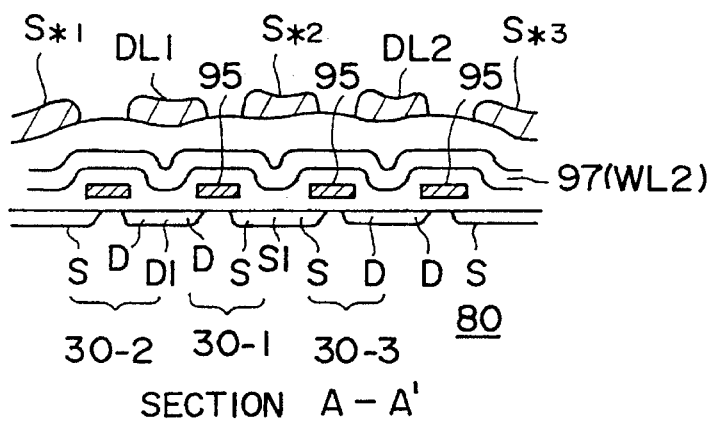
FIG. 31 is a cross sectional view taken along the A—A line of FIG. 30.
Figure 32:
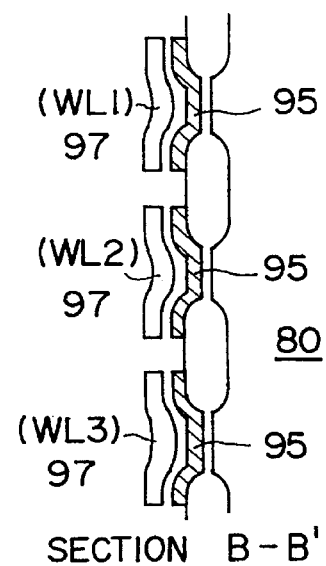
FIG. 32 is a cross sectional view taken along the B—B line of FIG. 30.

An example of an actual layout of the embodiment of FIG. 29 is shown in FIGS. 30 to 32. Particularly as seen from FIG. 31, diffused layers for the source S and the drain D are provided one after another in a word line direction. These diffused layers are commonly used with respect to adjacent two transistors. Namely, when attention is drawn to, e.g., memory cells 30-1 and 30-2, the drain D1 existing therebetween is commonly used as drains D and D of the memory cells 30-1 and 30-2. Further, the source S1 existing between memory cells 30-1 and 30-3 is commonly used as sources S and S for these two memory cells. Namely, it is unnecessary to provide an isolation field oxide film between respective memory cells. Actually, no field oxide film exists. For this reason, miniaturization in a word line direction can be attained.

Particularly, as seen from FIG. 30, data lines DL1, DL2, ... and common sources (source wirings) S*1, S*2, ... are formed by an Aluminum interconnection layer in upper and lower directions in the figure. These data lines and source wirings are connected to diffused layers (sources, drains) by contacts 90, 90, ... at a predetermined interval. The interval between contacts is set to a value such that the resistance of the diffused layer for the drain or source does not affect the characteristic.

Most of the above-described respective embodiments are of the 1 bit type. However, as shown in FIG. 12, a structure of the multibit type may be employed.

While it is shown in FIGS. 9 to 18 that each gate of the select transistors 1, 1A and 1B of the cell is comprised of a conductive layer (e.g., polysilicon) of the second layer, there may be employed an arrangement such that a double layer structure comprised of a conductive layer (e.g., polysilicon) of the first layer and a conductive layer of the second layer forming the floating gate is formed to etch the insulating film between the conductive layers of the first and second layers so that these conductive layers are short-circuited. When such a configuration is employed, select transistors 1, 1A and 1B can be formed by the same process as that forming the floating gate transistor 2. The processing margin is therefore improved.

What is claimed is:

1. A non-volatile semiconductor memory device, comprising:

a plurality of non-volatile memory cells arranged in a matrix to form a cell array, said memory cells comprising transistors having floating gates;

a plurality of data lines for transmitting data to the memory cells of respective columns of said cell array and receiving data therefrom;

a plurality of word lines for selecting the memory cells of respective rows of said cell array to connect selected memory cells to corresponding data lines;

a column decoder for selecting said data lines;

a row decoder for selecting said word lines;

a pair of memory cells of said plurality of memory cells selected by a corresponding one of said word lines and said data lines, said pair of memory cells comprising a plurality of transistors and connected to said corresponding one of said data lines by a common contact portion to constitute a one bit data memory unit for storing one bit data; said plurality of transistors of said pair of memory cells included in said one bit data memory unit being arranged in a parallel relationship with respect to each other; and a plurality of select transistors respectively provided for said plurality of transistors and which are turned ON and OFF by said corresponding one of said word lines and which are provided between said common contact portion and drains of said plurality of transistors of said pair of memory cells, said plurality of transistors of said pair of memory cells and said corresponding select transistors being arranged in a series relationship with respect to said corresponding data line, said plurality of select transistors being arranged in a parallel relationship with respect to each other, and gates of said each of said plurality of select transistors being commonly connected to said corresponding word line, drains of each of said plurality of select transistors being commonly connected to said common contact portion, and sources of each of said plurality of select transistors being respectively connected to drains of said corresponding transistors of said pair of memory cells, wherein said each of said memory cells comprises a drain side diffused layer and a source side diffused layer formed in a manner that a channel region is positioned therebetween on a surface of a semiconductor substrate, a floating gate comprises a first polycrystalline silicon layer and a control gate comprises a second polycrystalline silicon layer formed close to said source side diffused layer and above said channel region, and wherein said select transistors each have a select gate which comprises a third polycrystalline silicon layer at a position close to said drain side diffused layer and above said channel region.

2. A non-volatile semiconductor memory device, comprising:

a plurality of non-volatile memory cells arranged in a matrix to form a cell array, said memory cells comprising transistors having floating gates;

a plurality of data lines for transmitting data to the memory cells of respective columns of said cell array and receiving data therefrom;

a plurality of word lines for selecting the memory cells of respective rows of said cell array to connect selected memory cells to corresponding data lines;

a column decoder for selecting said data lines;

a row decoder for selecting said word lines;

a pair of memory cells of said plurality of memory cells selected by a corresponding one of said word lines and said data lines, said pair of memory cells comprising a plurality of transistors and connected to said corresponding one of said data lines by a common contact portion to constitute a one bit data memory unit for storing one bit data, said plurality of transistors of said pair of memory cells included in said one bit data memory unit being arranged in a parallel relationship with respect to each other; and a plurality of select transistors respectively provided for said plurality of transistors and which are turned ON and OFF by said corresponding one of said word lines and which are provided between said common contact portion and drains of said plurality of transistors of said pair of memory cells, said plurality of transistors of said pair of memory cells and said corresponding select transistors being arranged in a series relationship with respect to said corresponding data line, wherein said each of said memory cells comprises a drain side diffused layer and a source side diffused layer formed in a manner that a channel region is positioned therebetween on a surface of a semiconductor substrate, a floating gate comprises a first polycrystalline silicon layer and a control gate comprises a second polycrystalline silicon layer formed close to said source side diffused layer and above said channel region, wherein said select transistors each have a select gate which comprises a third polycrystalline silicon layer at a position close to said drain side diffused layer and above said channel region, and wherein said first polycrystalline silicon layer is totally covered by said second polycrystalline silicon layer.

3. A non-volatile semiconductor memory device as set forth in claim 1, further comprising an insulating film positioned between said second polycrystalline silicon layer and said third polycrystalline silicon layer.

4. A non-volatile semiconductor memory device as set forth in claim 3, further comprising a nitride layer positioned between said first polycrystalline silicon layer and said second polycrystalline silicon layer.

5. A non-volatile semiconductor memory device as set forth in claim 3, wherein said insulating film comprises:

a first oxide layer;

a nitride layer formed on top of said first oxide layer; and a second oxide layer formed on top of said nitride layer.

6. A non-volatile semiconductor memory device, comprising:

a plurality of non-volatile memory cells arranged in a matrix to form a cell array, said cells comprising transistors having floating gates;

a plurality of data lines for transmitting data to the memory cells of respective columns of said cell array and receiving data therefrom;

a plurality of word lines for selecting the memory cells of respective rows of said cell array to connect selected memory cells to corresponding data lines;

a column decoder for selecting said data lines;

a row decoder for selecting said word lines;

a pair of memory cells of said plurality of memory cells selected by a corresponding one of said word lines and said data lines, said pair of memory cells comprising a plurality of transistors and connected to said corresponding one of said data lines by a common contact-portion-where drains of said plurality of transistors of said pair of memory cells are commonly connected to constitute a one bit data memory unit for storing one bit data; said plurality of transistors of said pair of memory cells included in said one bit data memory unit being arranged in a parallel relationship with respect to each other, and a select transistor which is turned ON and OFF by said corresponding one of said word lines and which is provided between said common contact portion and commonly connected drain of said plurality of transistors of said pair of memory cells, said plurality of transistors of said pair of memory cells and said select transistor being arranged in a series relationship with respect to said corresponding data line, wherein source regions of each of said plurality of transistors of said pair of memory cells comprising said one bit memory unit are separately provided, and wherein said source regions are each disposed having directions at an angle of substantially 45 degrees with respect to a running direction of said corresponding one of said word lines.

* * * * *